United States Patent [19]

Okuaki

[11] Patent Number: 4,814,943
[45] Date of Patent: Mar. 21, 1989

[54] PRINTED CIRCUIT DEVICES USING THERMOPLASTIC RESIN COVER PLATE

[75] Inventor: Hiroshi Okuaki, Tokyo, Japan

[73] Assignee: Oki Electric Industry Co., Ltd., Tokyo, Japan

[21] Appl. No.: 57,385

[22] Filed: Jun. 2, 1987

[30] Foreign Application Priority Data

Jun. 4, 1986 [JP] Japan .................. 61-129488
Jul. 4, 1986 [JP] Japan .................. 61-157264

[51] Int. Cl.⁴ ..................... H05K 1/18
[52] U.S. Cl. .................. 361/400; 206/328; 174/52.4; 174/52.2; 174/52.3
[58] Field of Search ............... 361/400, 399; 174/52 PE, 52 FP, 52 S; 206/328, 329, 332

[56] References Cited

U.S. PATENT DOCUMENTS

| | | | |
|---|---|---|---|
| 3,110,836 | 11/1963 | Blazek | 174/52 FP X |
| 3,388,465 | 6/1968 | Johnston | 361/400 X |
| 3,404,215 | 10/1968 | Bruks et al. | 174/52 FP |
| 3,616,533 | 11/1971 | Heap et al. | 174/52 FP |
| 3,693,252 | 9/1972 | Robertson et al. | 174/52 PE |
| 3,756,399 | 9/1973 | Cosier et al. | 206/328 X |
| 4,029,999 | 6/1977 | Neumann et al. | 361/400 X |
| 4,159,648 | 7/1979 | Prosky | 361/400 X |
| 4,312,116 | 1/1982 | Moser et al. | 174/52 S X |
| 4,372,037 | 2/1983 | Scapple et al. | 361/400 X |
| 4,483,067 | 11/1984 | Parmentier | 174/52 PE |
| 4,499,333 | 2/1985 | Chee et al. | 174/52 FP |
| 4,541,003 | 9/1985 | Otsuka et al. | 174/52 PE X |
| 4,546,412 | 10/1985 | Nakazawa et al. | 174/52 PE X |
| 4,567,545 | 1/1986 | Mettler, Jr. | 184/52 FP X |
| 4,635,165 | 1/1987 | Okuaki | |
| 4,649,415 | 3/1987 | Herbert | 174/52 FP X |
| 4,677,528 | 6/1987 | Miniet | 361/399 X |
| 4,696,526 | 9/1987 | Newton et al. | 174/52 FP X |
| 4,702,370 | 10/1987 | Handa | 206/332 X |
| 4,727,246 | 2/1988 | Hara et al. | 174/52 FP X |
| 4,736,841 | 4/1988 | Kaneko et al. | 206/332 X |
| 4,763,407 | 8/1988 | Abe | 174/52 PE X |

FOREIGN PATENT DOCUMENTS 2058506 4/1981 United Kingdom ............ 174/52 H

Primary Examiner—R. R. Kucia
Attorney, Agent, or Firm—Wenderoth, Lind & Ponack

[57] ABSTRACT

A printed circuit device including semiconductor IC chips on the surface of a printed circuit board made of insulating material. The printed circuit board includes on the surface thereof semiconductor mounting regions and conductive layers. The semiconductor IC chips are respectively fixedly mounted on the semiconductor element mounting regions disposed on the printed circuit board. Thin metal wires interconnect electrodes of the IC chips with the conductive layers. A sealing cover plate having a plurality of recesses formed therein is fixedly mounted onto the surface of the printed circuit board with adhesive for hermetically sealing each of the IC chips and electric wires with a respective one of the recesses in the cover plate. The cover plate can comprise a composite of a thermoplastic resin material layer and a metal layer, such as aluminum or an aluminum alloy.

6 Claims, 4 Drawing Sheets

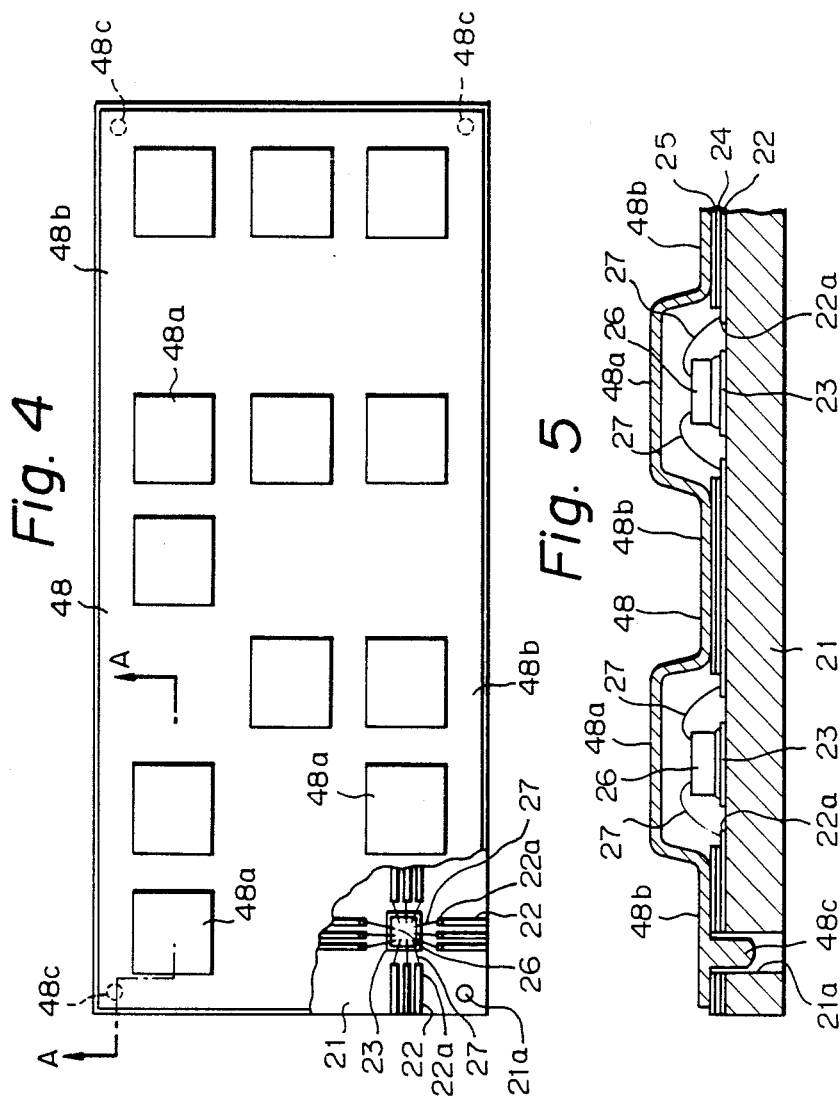

PRINTED CIRCUIT DEVICES USING THERMOPLASTIC RESIN COVER PLATE

BACKGROUND OF THE INVENTION

1. Field of the Invention

The present invention relates to an electronic device composed of a printed circuit board including a semiconductor chip mounted thereon.

2. Description of the Prior Art

In order to protect an IC chip exposed on the surface of a printed circuit board from moisture or impurities, it is indispensable to seal the IC chip with resin or a can.

Prior techniques of this type are described in Japanese Utility Model Publication No. 55-47065, for example.

In what follows, a prior art printed circuit construction will be described with reference to FIG. 1.

As shown in FIG. 1, an IC chip (4) is fixedly mounted on a printed circuit board (1) with use of an adhesive (5). The IC chip (4) is electrically connected with a conductive layer (2) via metal wires (6). An insulating frame (7) is fixedly mounted onto the conductive layer (2) with an adhesive (8). The frame (7) is filled therein with a sealing material (9) to seal the IC chip (4) and the periphery thereof.

For the sealing material (9), an epoxy resin pellet prepared for example by cold molding or pressure molding is melted in the frame (7), which frame is then filled therewith. The melted resin is thereafter hardened.

As described above, such prior printed circuit devices necessitate some processes of mounting of the frame (7), throwing of the resin pellet into the frame (7), and melting and hardening of that resin pellet. This increases the cost of manufacture of the device.

SUMMARY OF THE INVENTION

In view of the drawbacks of the prior techniques, it is an object of the present invention to provide a printed circuit device with high reliability.

Another object of the present invention is to provide a printed circuit device using a sealing cover made of thermoplastic resin for protection of an IC chip.

Still another object of the present invention is to provide a printed circuit device which can be manufactured at a low cost.

The printed circuit device of the present invention includes:

(a) a printed circuit board of electrically insulating material having on its surface a plurality of semiconductor element mounting regions and a plurality of conductive wiring layers;

(b) a plurality of semiconductor IC chips fixedly mounted by means of conductive adhesive paste on each mounting region, each IC chip including a plurality of electrodes on its surface;

(c) metal wires for electrically connecting said conductive wiring layers provided on the printed circuit board to the plurality of electrodes of the IC chips;

(d) a protective layer of plastic resin material formed over the conductive wiring layers for protecting the wiring layers from damage;

(e) a layer of a thermoplastic resin material formed on the surface of the protective layer;

(f) a sealing cover plate of a thermoplastic resin material adhesively mounted on the printed circuit board through a heat bonding process, the plate having a plurality of recessed portions, each of which hermetically accommodates one of the chips.

The above and other objects, features and advantages of the present invention will become more apparent from the following description when taken in conjunction with the accompanying drawings in which a preferred embodiment of the present invention is shown by way of illustrated example.

BRIEF DESCRIPTION OF THE DRAWINGS

FIG. 4 is a plan view illustrating a second embodiment of the printed circuit device of the present invention;

FIG. 5 is a cross sectional view of the second embodiment shown in FIG. 4 taken along a line A—A of the same figure;

DESCRIPTION OF THE PREFERRED EMBODIMENTS

A preferred embodiment of a printed circuit device according to the present invention will be described with reference to FIG. 2.

Figure 1:
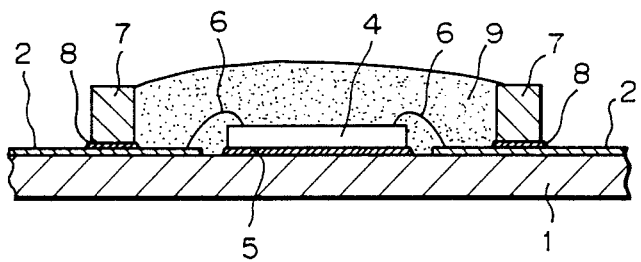
FIG. 1 is a cross sectional view illustrating a prior art printed circuit device.
Figure 2:
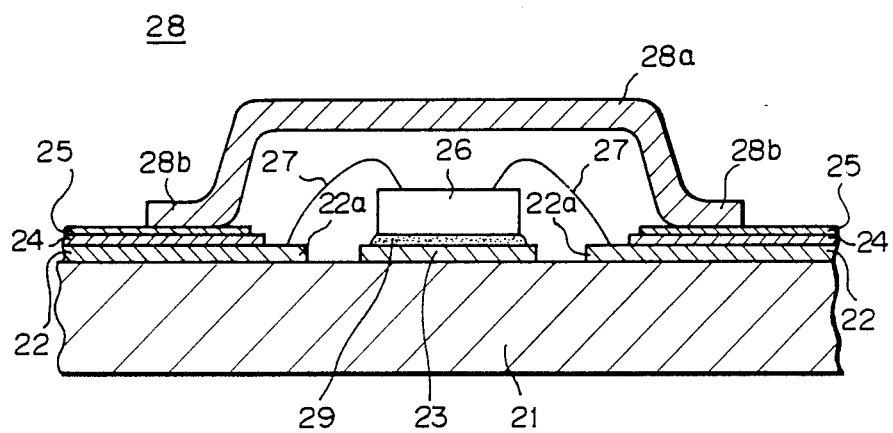
FIG. 2 is a cross sectional view illustrating a first embodiment of a printed circuit device according to the present invention.

As shown in FIG. 2, an insulating printed circuit board (21) has on its surface a conductive layer (22) of plated copper foil printed thereon and an IC chip mounting region (23). The board (21) is made of a glass epoxy resin, a thermoplastic resin, ceramic, glass, and etc. The conductive layer (22) has a connection part (22a) plated with gold or silver, other portions of which are coated with an insulating protective film (24) for preventing the conductive layer (22) from being destroyed due to any corrosion by invaded moisture and owing to any mechanical damage. An adhesive layer (25) is formed on the protective film (24).

The protective film (24) is formed by, for example, rendering an epoxy resin to a silk screen printing process.

An IC chip (26) is fixedly mounted onto the IC chip region (23) by adhering with an adhesive (29) or by employing a Au-Si eutectic alloy reaction. For the adhesive (29), a conductive epoxy resin paste including Ag is employed, for example.

The connection part (22a) of the conductive layer (22) is electrically connected with electrodes of the IC chip (26) via aluminum or gold wires (27).

A sealing cover (28) with a recessed portion (28a) is disposed over the IC chip (26). The sealing cover (28) has a brim (28b) to increase its contacting area with the protective film (24) for thereby improving sealing strength and water resistance. The brim (28b) is fixed to the adhesive layer (25) by making use of heating contact bonding, high frequency induction heating, and ultrasonic vibration, for example. The sealing cover (28) is integrally formed by heating thermoplastic resin such as polyethylene, polypropylene, or polymethylpentene. The polymethylpentene resin is preferable in particular as a sealing cover for an EPROM since it is capable of transmitting ultraviolet radiation.

The adhesive layer (25) is made of a thermoplastic resin in a single layer or a plurality of layers. In order to improve melting properties and sealing strength, the same material as that of the sealing cover (28) is preferable for the adhesive layer (25).

The protective film (24) described in the above embodiment is not necessarily needed.

A process of manufacture of the printed circuit device according to the present invention will be described with reference to FIG. 3.

Figure 3:
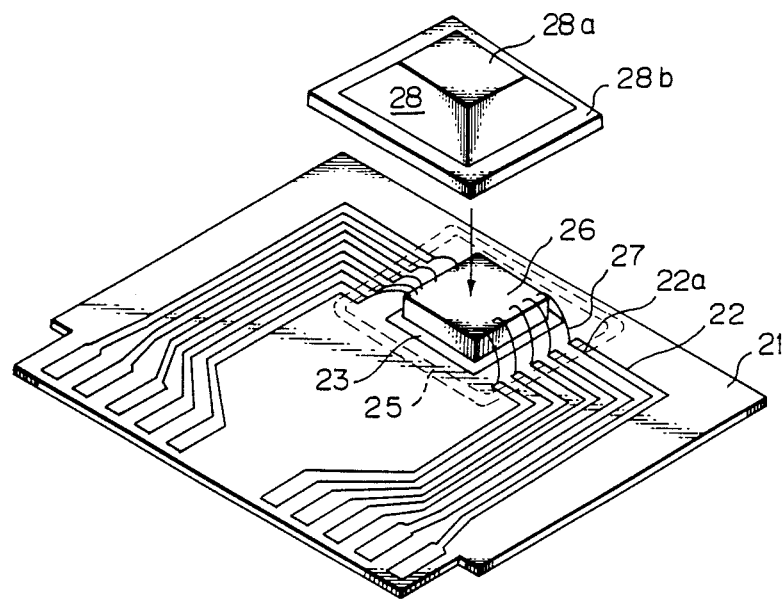
FIG. 3 is a perspective view illustrating a process of manufacturing the printed circuit device of the present invention.
Figure 3:
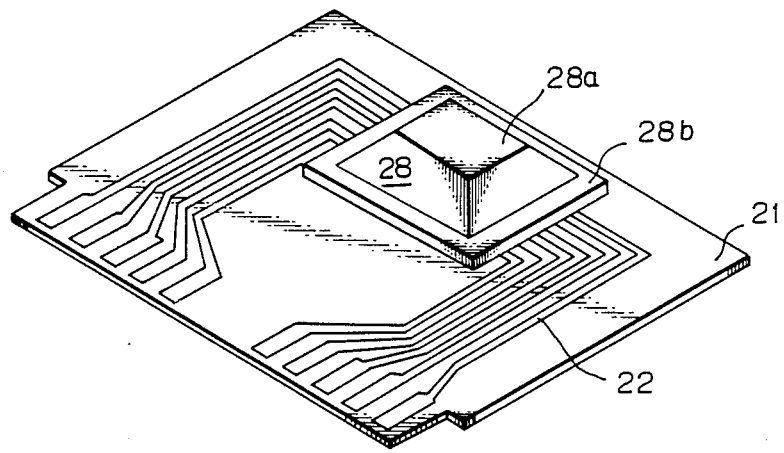

First of all, as shown in FIG. 3(1), the conductive layer (22) and the IC chip mounting region (23) are formed on the surface of the insulating printed circuit board (21). The adhesive layer (25) is formed on the conductive layer (22).

The IC chip (26) is sealed onto the IC chip mounting region (23) with use of an adhesive or by making use of a Au-Si eutectic alloy reaction. The connection part (22a) of the conductive layer (22) is electrically connected to the electrodes of the IC chip (26) via gold wires 27.

The sealing cover (28) having the recessed portion (28a) and the brim (28b) is integrally formed. The IC chip (26) is covered with the sealing cover (28) under an atmosphere of inactive gas such as N₂ or clean dry air, as shown in FIG. 3(2). The brim (28b) is sealed to the adhesive layer (25).

According to the first embodiment as described above, it is possible to reduce the IC manufacturing cost because the step of using a resin pellet is not needed to seal an IC chip. Furthermore, the printed circuit device according to the present invention makes it possible to employ an automatic sealing process because the hermetic sealing is accomplished only by a resin melting process.

In succession, a second embodiment of the printed circuit device according to the present invention will be described with reference to FIGS. 4 and 5. FIG. 5 is a cross sectional view of the second embodiment taken along line A—A of FIG. 4.

As illustrated in FIGS. 4 and 5, the sealing cover plate (48) has a plurality of recessed portions (48a) and a plurality of projections (48c). A printed circuit board (21) has a plurality of IC chip mounting regions (23) and a plurality of holes (21a).

A plurality of IC chips (26) are fixedly mounted respectively onto the mounting regions (23). A connection part (22a) of a conductive layer (22) is electrically connected with electrodes of the IC chips (26) by means of metal wires (27).

The projections (48c) are inserted into the holes (21a) and the sealing cover plate (48) is arranged on the printed circuit board (21). A flat part (48b) of the adhered cover (48) is sealed to an adhesive layer (25) on a protective film (24).

According to this second embodiment, as described above, a plurality of the IC chips (26) are sealed at the same time, whereby the number of steps for of manufacture of the device and working time can be reduced. The projections (48c) of the sealing cover plate (48) inserted into the holes (21a) in the printed circuit board (21) simplifies alignment of the sealing cover (48) with the board (21) for thereby preventing improper sealing. The projections may instead be formed on the printed circuit board (21), and the holes may be formed in the sealing cover (48).

Another embodiment of a sealing cover for use in the printed circuit device of the present invention will be described with reference to FIGS. 6 and 7.

Figure 6:
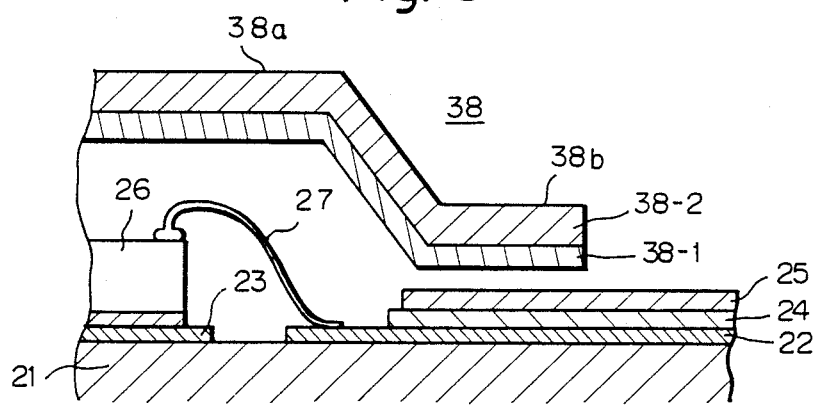
FIG. 6 is a cross sectional view illustrating another embodiment of a sealing cover for use in the present invention.
Figure 7:
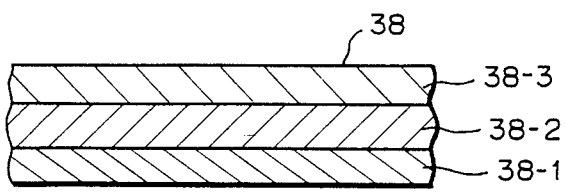
FIG. 7 is a cross sectional view illustrating another embodiment of the cover for use in the present invention.

As shown in FIG. 6, a sealing cover plate (38) provided with a recessed portion (38a) and a brim (38b) has a composite structure composed of a thermoplastic resin layer (38-1) and a sheet-shaped or mesh-shaped metal layer (38-2). The metal layer (38-2) is made of aluminum, or anodized aluminum, or an aluminum alloy, for example. Formation of another thermoplastic resin layer (38-3) on the metal layer (38-2) as shown in FIG. 7 prevents corrosion of the metal layer (38-2). This multilayer structure may include an aluminum or an aluminum alloy layer as an intermediate layer and anodized aluminum layers as the upper and lower layers.

According to the above described embodiment, the sealing cover plate (38) is improved in its mechanical strength because of the use of the metal layer (38-2) backing the thermoplastic resin layer (38-1).

A polymethyl pentene which can transmit ultraviolet rays is suitable for an EPROM IC chip mounted circuit board. In this case, a metal cover plate with a window is required to receive ultraviolet rays.

A third embodiment of the printed circuit device of the present invention will be described with reference to FIG. 8.

Figure 8:
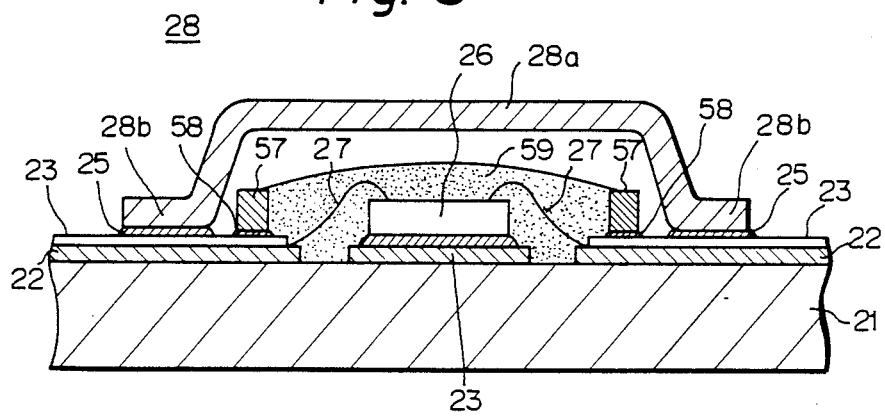
FIG. 8 is a cross sectional view illustrating a third embodiment of the printed circuit device of the present invention.

In FIG. 8, the arrangement of a printed circuit board (21) and a sealing cover plate (28) are the same as those of the first embodiment shown in FIG. 2.

In the first place, an IC chip (26) is fixedly mounted onto an IC chip mounting region (23) of the board (21) with an adhesive (29). The IC chip (26) is electrically connected to a conductive layer (22) via metal wires (27). A frame (57) is fixedly mounted onto a protective film (23) with use of an adhesive (58) so as to enclose the IC chip (26) and the wire (27). The frame (57) is filled therein with a sealing material (59) to seal the IC chip (26) and the periphery thereof.

The frame (57) is constructed by stamping out a piece of a paper or cloth impregnated with epoxy resin or phenolic resin. For the sealing material (59), resins such as epoxy, silicone, polyimide and the like are employed. A method of filling the frame with such resin is found in the "Description of the Prior Art".

Then, a sealing cover plate (28) having a brim (28b) is covered over the IC chip (26) under an atmosphere of N₂ or clean dry air. The brim (28b) is welded onto the board (21) via an adhesive layer (25).

According to the third embodiment, as described above, the sealing cover plate (28) covers the sealing material (59) to thereby remarkably improve sealing properties for the IC chip (26).

Although certain preferred embodiments have been shown and described, it should be understood that many changes and modifications may be made thereto without departing from the scope of the appended claims.

What is claimed is:
1. A printed circuit device comprising:
(a) a printed circuit board having on the surface thereof a plurality of semiconductor element mounting regions and a plurality of conductive wiring layers, said printed circuit board being of an electrically insulating material;

(b) a plurality of semiconductor integrated circuit chips each adhesively mounted on a respective one of said mounting regions with a conductive adhesive paste material;

(c) metal wires electrically connecting electrodes of said chips with said conductive wiring layers;

(d) a protective layer formed over said wiring layers for protecting said wiring layers from damage, said protective layer being of a plastic resin material;

(e) a layer of a thermoplastic resin material formed on the surface of said protective layer; and (f) a sealing cover plate of a thermoplastic resin material adhesively mounted on the surface of said board through a heat bonding process, said plate having a plurality of recessed portions, each of which hermetically accommodates one of said chips, said recessed portions of said sealing cover plate being separated from said chips by an empty space.

2. A printed circuit device according to claim 1, wherein said printed circuit board has positioning holes located near a periphery of said board and wherein said sealing cover plate has a plurality of projections respectively inserted into said holes for providing easy alignment of said sealing cover plate with said board.

3. A printed circuit device according to claim 1, wherein said thermoplastic resin material comprises a material selected from the group consisting of polyethylene, polypropylene and polymethylpentene.

4. A printed circuit device according to claim 3, further comprising a plurality of frame means of a resin impregnated material each mounted on said protective layer and surrounding one of said semiconductor integrated circuit chips and said metal wires; and a sealing material layer filled in said frame means to protect each of said chips from moisture.

5. A printed circuit device according to claim 3, further comprising a metal layer next to said cover of a thermoplastic resin material to mechanically strengthen said cover.

6. A printed circuit device comprising:

(a) a printed circuit board having on the surface thereof a plurality of semiconductor element mounting regions and a plurality of conductive wiring layers, said printed circuit board being of an electrically insulating material;

(b) a plurality of semiconductor integrated circuit chips each adhesively mounted on a respective one of said mounting regions with a conductive adhesive paste material;

(c) metal wires electrically connecting electrodes of said chips with said conductive wiring layers;

(d) a protective layer formed over said wiring layers for protecting said wiring layers from damage, said protective layer being of a plastic resin material;

(e) a layer of a thermoplastic resin material formed on the surface of said protective layer; and (f) a sealing cover plate of a thermoplastic resin material adhesively mounted on the surface of said board through a heat bonding process, said plate having a plurality of recessed portions, each of which hermetically accommodates one of said chips, said sealing cover plate including a flat portion thereof surrounding each of said recessed portions, said flat portion being adhered to said layer of thermoplastic resin on the surface of said protective layer.

* * * * *